United States Patent
Yu (10) Patent No.: US 7,808,404 B1
(45) Date of Patent: *Oct. 5, 2010

(54) METHOD AND APPARATUS FOR GENERATING A SEED SET IN A DATA DEPENDENT SEED SELECTOR

(75) Inventor: Zhan Yu, Sunnyvale, CA (US)

(73) Assignee: Marvell International Ltd., Hamilton (BM)

(*) Notice: Subject to any disclaimer, the term of this patent is extended or adjusted under 35 U.S.C. 154(b) by 867 days.

This patent is subject to a terminal disclaimer.

(21) Appl. No.: 11/649,038

(22) Filed: Jan. 2, 2007

Related U.S. Application Data (63) Continuation of application No. 10/894,864, filed on Jul. 20, 2004, now Pat. No. 7,158,058, which is a continuation of application No. 10/652,801, filed on Aug. 29, 2003, now abandoned.

(60) Provisional application No. 60/432,109, filed on Dec. 9, 2002.

(51) Int. Cl.
*H03M 5/00* (2006.01)

(52) U.S. Cl. .................. 341/58; 341/59; 341/60; 341/107; 714/738; 714/739; 714/742

(58) Field of Classification Search .................. 341/58, 341/59, 50–107; 714/738, 739, 742, 268
See application file for complete search history.

(56) References Cited

U.S. PATENT DOCUMENTS

| | | | |
|---|---|---|---|
| 4,509,118 A | 4/1985 | Shenk | |
| 4,649,540 A | 3/1987 | Proebsting | |
| 4,780,875 A | 10/1988 | Sakai | |
| RE33,189 E | 3/1990 | Lee et al. | |
| 4,914,535 A | 4/1990 | Weng | |
| 4,958,352 A | 9/1990 | Noguchi et al. | |
| 4,978,955 A | 12/1990 | Howell | |
| 4,993,029 A | 2/1991 | Galbraith et al. | |
| 5,068,755 A | 11/1991 | Hamilton et al. | |
| 5,075,804 A | 12/1991 | Deyring | |
| 5,115,467 A | 5/1992 | Esserman et al. | |
| 5,255,136 A | 10/1993 | Machado et al. | |
| 5,257,143 A | 10/1993 | Zangenehpour | |
| 5,274,509 A | 12/1993 | Buch | |
| 5,276,564 A | 1/1994 | Hessing et al. | |
| 5,289,476 A | 2/1994 | Johnson et al. | |

(Continued)

FOREIGN PATENT DOCUMENTS

EP      522750 A2      7/1991

(Continued)

OTHER PUBLICATIONS

U.S. Appl. No. 10/423,552, filed Apr. 25, 2003, entitled, "Improved Data Coding for Enforcing Constraints on Ones and Zeros in a Communications Channel".

(Continued)

*Primary Examiner*—Linh V Nguyen (57) ABSTRACT

A seed generator for a scrambler comprises a seed set identifier that identifies a seed set based on received user data symbols, which include a plurality of M-bit symbols. A seed selector selects a scrambling seed for the scrambler from the seed set based on Hamming distances between at least two of the M-bit symbols in the seed set.

16 Claims, 10 Drawing Sheets

U.S. PATENT DOCUMENTS

| | | | |
|---|---|---|---|
| 5,371,734 A * | 12/1994 | Fischer | 370/311 |
| 5,377,265 A | 12/1994 | Wettengel et al. | |
| 5,383,205 A | 1/1995 | Makihara et al. | |
| 5,420,893 A | 5/1995 | Ward | |
| 5,422,763 A | 6/1995 | Harris | |
| 5,455,721 A | 10/1995 | Nemazie et al. | |
| 5,523,903 A | 6/1996 | Hetzler et al. | |
| 5,570,307 A | 10/1996 | Takahashi | |
| 5,592,348 A | 1/1997 | Strang, Jr. | |
| 5,627,695 A | 5/1997 | Prins et al. | |
| 5,640,286 A | 6/1997 | Acosta et al. | |
| 5,712,863 A | 1/1998 | Gray | |
| 5,745,522 A | 4/1998 | Heegard | |
| 5,764,771 A | 6/1998 | De Vito et al. | |
| 5,784,010 A | 7/1998 | Coker et al. | |
| 5,815,514 A | 9/1998 | Gray | |
| 5,818,654 A | 10/1998 | Reddy et al. | |
| 5,844,509 A | 12/1998 | Behrens et al. | |
| 5,898,394 A * | 4/1999 | Kobayashi et al. | 341/58 |
| 5,931,968 A | 8/1999 | Gray | |
| 5,944,842 A | 8/1999 | Propp et al. | |
| 6,003,153 A | 12/1999 | Shimoda | |
| 6,009,550 A | 12/1999 | Gosula et al. | |
| 6,032,284 A | 2/2000 | Bliss | |
| 6,052,815 A | 4/2000 | Zook | |
| 6,052,817 A | 4/2000 | Whaley | |
| 6,137,646 A | 10/2000 | Okamura et al. | |
| 6,177,890 B1 * | 1/2001 | Keirn et al. | 341/59 |
| 6,185,717 B1 | 2/2001 | Fukunaga et al. | |
| 6,260,171 B1 | 7/2001 | Gray | |
| 6,295,371 B1 * | 9/2001 | Rucklidge et al. | 382/176 |
| 6,308,295 B1 | 10/2001 | Sridharan et al. | |
| 6,351,538 B1 * | 2/2002 | Uz | 380/201 |
| 6,360,347 B1 | 3/2002 | Walters, Jr. | |
| 6,363,512 B2 | 3/2002 | Gray | |
| 6,384,747 B1 | 5/2002 | Reed et al. | 341/59 |
| 6,438,724 B1 | 8/2002 | Cox et al. | |
| 6,449,111 B1 | 9/2002 | Kool et al. | |
| 6,513,139 B2 | 1/2003 | Gray | |
| 6,557,136 B1 | 4/2003 | Friedmann | |
| 6,631,490 B2 | 10/2003 | Shimoda | |
| 6,738,935 B1 * | 5/2004 | Kimmitt | 714/701 |
| 6,792,566 B2 | 9/2004 | Chen et al. | |
| 6,896,094 B2 | 5/2005 | Chabaan | 180/446 |
| 6,897,792 B1 | 5/2005 | Feng | 341/59 |
| 6,925,371 B2 | 8/2005 | Yasui et al. | |
| 6,986,094 B2 * | 1/2006 | Grimsrud | 714/759 |
| 7,006,016 B1 | 2/2006 | Feng | 341/58 |
| 7,023,881 B1 * | 4/2006 | Bendak et al. | 370/470 |
| 7,034,719 B2 | 4/2006 | Shim et al. | |
| 7,142,133 B2 | 11/2006 | Shim et al. | |
| 7,218,255 B1 * | 5/2007 | Feng et al. | 341/58 |
| 7,248,188 B2 | 7/2007 | Ito et al. | |
| 2001/0007578 A1 | 7/2001 | Ran et al. | |
| 2002/0044767 A1 | 4/2002 | Kwak | |
| 2002/0049949 A1 | 4/2002 | Shimoda | |
| 2002/0122469 A1 | 9/2002 | Doetsch et al. | |
| 2002/0172179 A1 | 11/2002 | Grimsrud | 370/342 |
| 2003/0014634 A1 | 1/2003 | Petrovic | |
| 2003/0066014 A1 | 4/2003 | Van Dijk et al. | |
| 2003/0135798 A1 | 7/2003 | Katayama et al. | 714/710 |

FOREIGN PATENT DOCUMENTS

EP  0926671 A1  6/1999

OTHER PUBLICATIONS

U.S. Appl. No. 10/639,796, filed Aug. 12, 2003, entitled, "Methods and Apparatus for Improving Minimum Hamming Weights of a Sequence".

* cited by examiner

| Relationship | Symbols Designated as Used | Amount | Min. Hamming Distance | Min. Hamming Weight | Max. Sequence Size |
|---|---|---|---|---|---|
| $d(D_i, D_{i-1}) \geq 3$ | $D_i, D_{i-1}$ | 2 | {1,2} or {2,1} | 15.0% | 255 |
| $d(D_i, D_{i-1}) = 2$ | $D_i, D_{i-1}, X, Y$ (where $d(X, D_i) = d(X, D_{i-1}) = 1$ and $d(Y, D_i) = d(Y, D_{i-1}) = 1$) | 4 | {1,3} or {3,1} | 20.0% | |
| $d(D_i, D_{i-1}) = 1$ | $D_i, D_{i-1}$ | 2 | {1,2} or {2,1} | 15.0% | |
| $D_i = D_{i-1}$ | $D_i, D_{i-2}, Z$ (where $d(Z, D_i) = 1$) | 12 | {2,2,1} | 16.67% | |

| Relationship | Symbols Designated as Used | Amount | Min. Hamming Distance | Min. Hamming Weight | Max. Sequence Size |
|---|---|---|---|---|---|
| $d(D_i, D_{i-1}) \geq 3$ | $D_i, D_{i-1}$ | 2 | {1,2} or {2,1} | 15.0% | 312 |
| $d(D_i, D_{i-1}) = 2$ | $D_i, D_{i-1}, X, Y$ (where $d(X, D_i) = d(X, D_{i-1}) = 1$ and $d(Y, D_i) = d(Y, D_{i-1}) = 1$) | 4 | {1,3} or {3,1} | 20.0% | |
| $d(D_i, D_{i-1}) = 1$ | $D_i, D_{i-1}$ | 2 | {1,2} or {2,1} | 15.0% | |
| $D_i = D_{i-1}$ | $D_i, D_{i-2}, D_{i-3}, Z$ (where $d(Z, D_i) = 1$) | 13 | {2,2,1,1} | 15.0% | |

| Relationship | Symbols Designated as Used | Amount | Min. Hamming Distance | Min. Hamming Weight | Max. Sequence Size |
|---|---|---|---|---|---|
| $d(D_i, D_{i-1}) \geq 3$ | $D_i, \overline{D_i}, D_{i-1}, \overline{D_{i-1}}$ | 4 | {1,2} or {2,1} | 15.0% | 219 |
| $d(D_i, D_{i-1}) = 2$ | $D_i, \overline{D_i}, D_{i-1}, \overline{D_{i-1}}, X, Y$ (where $d(X, D_i) = d(X, D_{i-1}) = 1$ and $d(Y, D_i) = d(Y, D_{i-1}) = 1$) | 6 | {1,3} or {3,1} | 20.0% | |
| $d(D_i, D_{i-1}) = 1$ | $D_i, \overline{D_i}, D_{i-1}, \overline{D_{i-1}}$ | 4 | {1,2} or {2,1} | 15.0% | |
| $D_i = D_{i-1}$ | $D_i, \overline{D_i}, D_{i-2}, \overline{D_{i-2}}, Z$ (where $d(Z, D_i) = 1$) | 14 | {2,2,1} | 16.67% | |

FIG. 8A (172)

| Relationship | Symbols Designated as Used | Amount | Min. Hamming Distance | Min. Hamming Weight | Max. Sequence Size |
|---|---|---|---|---|---|
| $d(D_i, D_{i-1}) \geq 3$ | $D_i, \overline{D_i}, D_{i-1}, \overline{D_{i-1}}$ | 4 | {1,2} or {2,1} | 15.0% | 256 |
| $d(D_i, D_{i-1}) = 2$ | $D_i, \overline{D_i}, D_{i-1}, \overline{D_{i-1}}, X, Y$ (where $d(X, D_i) = d(X, D_{i-1}) = 1$ and $d(Y, D_i) = d(Y, D_{i-1}) = 1$) | 6 | {1,3} or {3,1} | 20.0% | |
| $d(D_i, D_{i-1}) = 1$ | $D_i, \overline{D_i}, D_{i-1}, \overline{D_{i-1}}$ | 4 | {1,2} or {2,1} | 15.0% | |
| $D_i = D_{i-1}$ | $D_i, \overline{D_i}, D_{i-2}, \overline{D_{i-2}}, D_{i-3}, \overline{D_{i-3}}, Z$ (where $d(Z, D_i) = 1$) | 16 | {2,2,1,1} | 15.0% | |

METHOD AND APPARATUS FOR GENERATING A SEED SET IN A DATA DEPENDENT SEED SELECTOR

CROSS-REFERENCE TO RELATED APPLICATIONS

This application is a continuation of U.S. Ser. No. 10/894,864, filed on Jul. 20, 2004, which is a continuation of U.S. Ser. No. 10/652,801, filed Aug. 29, 2003, which claims the benefit of U.S. Provisional Application No. 60/432,109, filed on Dec. 9, 2002. The disclosures of the above applications are incorporated herein by reference.

FIELD OF THE INVENTION

The present invention relates to data coding in communications channels, and more particularly to data coding that eliminates unwanted bit patterns in communications channels.

BACKGROUND OF THE INVENTION

Magnetic storage systems such as disk drives include a magnetic medium or platter with a magnetic coating that is divided into data tracks. The data tracks are divided into data sectors that store fixed-size data blocks. A read/write head typically includes a write circuit and a write element such as an inductor that selectively generates positive and negative magnetic fields that are stored by the magnetic medium. The stored positive and negative fields represent binary ones and zeros. The read/write head includes an element such as a magneto-resistive element that senses the stored magnetic field to read data from the magnetic medium. A spindle motor rotates the platter and an actuator arm positions the read/write head relative to the magnetic medium.

Magnetic storage systems typically code user data using Run Length Limited (RLL) code. RLL coding eliminates sequences in the user data that may degrade the performance of timing circuits of the magnetic storage system. For example, an RLL code enforces constraints on the number of consecutive ones and/or zeros that are permitted in the data. The efficiency of the RLL code is typically measured in terms of a code rate. For every m bits of user data, an encoded word with n bits is written to the storage media. RLL codes are used to eliminate unwanted bit patterns in the original data and typically do not have error correction capability.

Figure 1:
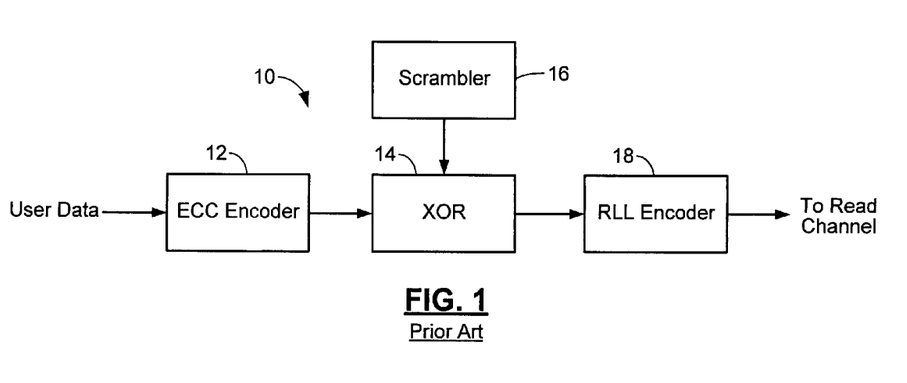
FIG. 1 is a block diagram of a write path in a data storage system according to the prior art.

Referring to FIG. 1, a write path 10 in a conventional data storage system includes an error correction coding (ECC) encoder (ENC) 12 that receives user data. The ECC ENC 12 generates cyclic redundancy check (CRC) and/or ECC bits that are appended to the user data. The user data, CRC bits, and/or ECC bits are output by the ECC ENC 12 to an input of an exclusive-OR (XOR) gate 14. Another input of the XOR gate 14 receives an output of a data scrambler 16, which generates a pseudo-random binary sequence. The data scrambler 16 is used here purely for the purpose of randomizing data and does not guarantee any sort of RLL constraint.

A scrambled output of the XOR gate 14 is input to a run length limited (RLL) ENC 18. The RLL ENC 18 encodes bit strings to prevent unwanted data patterns that violate the constraint and outputs a bit stream to a read channel (R/C). Typically, the RLL ENC 18 converts a block of $N_{RLL}$ bits into ($N_{RLL}$+1) bits to avoid the unwanted data patterns.

Figure 2:
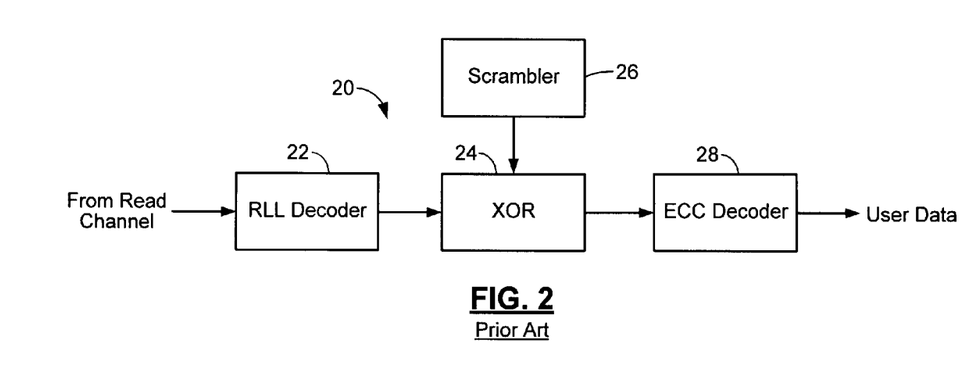
FIG. 2 is a block diagram of a read path in a data storage system according to the prior art.

Referring now to FIG. 2, a read path 20 of a data storage system includes an RLL decoder (DEC) 22 that receives the bit stream from the read channel and decodes the bit stream. An output of the RLL DEC 22 is input to an XOR gate 24. A data scrambler 26, which is the same as data scrambler 16, generates the pseudo-random binary sequence that is input to another input of the XOR gate 24. An output of the XOR gate 24 is input to an ECC DEC 28, which performs ECC decoding and outputs the user data. The RLL ENC 18 eliminates unwanted bit patterns. However, the RLL coding also reduces data storage capacity. In other words, RLL coding increases channel bit density (CBD), which reduces a signal-to-noise ratio (SNR) and leads to lower reliability.

SUMMARY OF THE INVENTION

A communications channel includes a buffer that receives user data symbols including a plurality of M-bit symbols. A seed selector receives the plurality of M-bit symbols, selectively removes symbols from a seed set based on Hamming distances between at least two of the M-bit symbols, and selects a scrambling seed from remaining symbols in the seed set. A scrambling device that communicates with the seed selector and the data buffer generates scrambled user data based on the user data symbols and the scrambling seed.

In other features, the communications channel is implemented in a data storage system. The seed selector ensures a minimum Hamming weight of 15 percent in the scrambled user data. The seed selector compares first and second user data symbols in the plurality of M-bit symbols.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses. For purposes of clarity, the same reference numbers will be used in the drawings to identify similar elements.

Hamming weight refers to the number of non-zero symbols in a symbol sequence. For binary signaling, Hamming weight refers to the number of "1" bits in the binary sequence. Low Hamming weight sequences (sequences with many zeros) adversely affect synchronization times and timing loops. Therefore, it is desirable to ensure a sufficient minimum Hamming weight in scrambled sequences.

Figure 3:
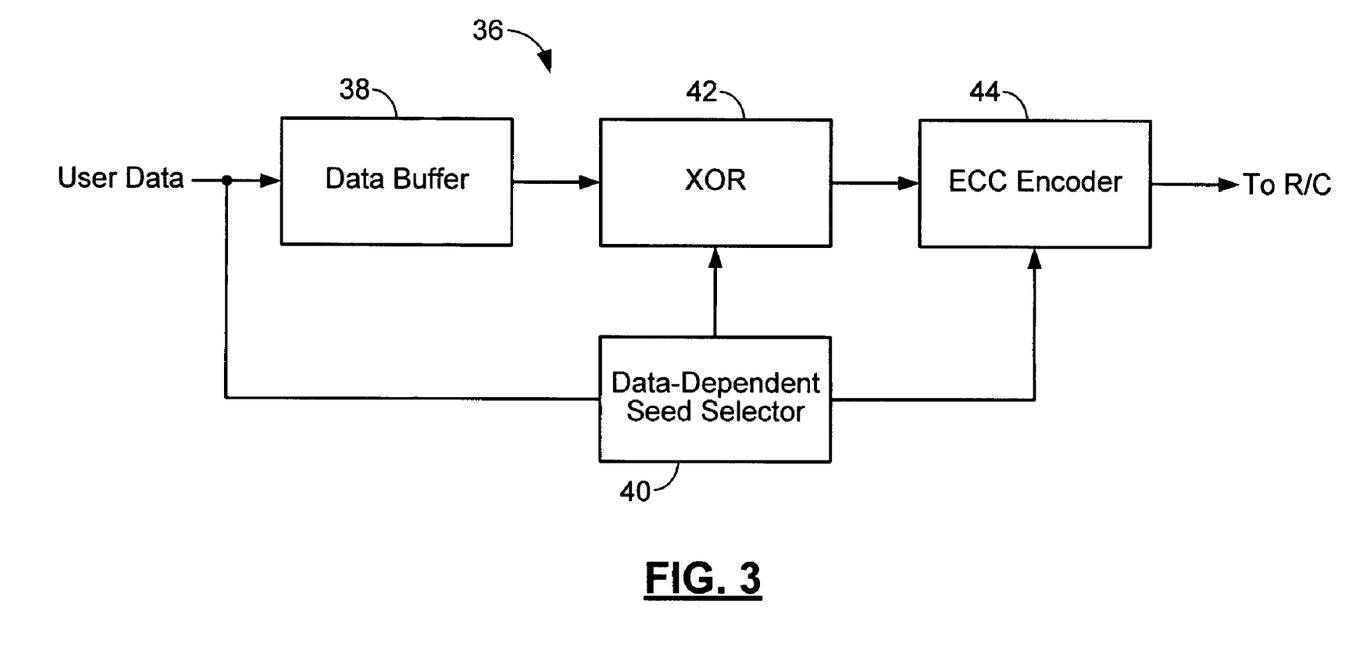
FIG. 3 is a block diagram of a data-dependent scrambler according to the present invention.

Referring now to FIG. 3, a write path 36 for a data storage system loads user data into a data buffer 38. It will be appreciated that the write path 36 may be a serial path or a parallel path. A data dependent seed selector 40 searches for a suitable scrambling sequence based on the user data and outputs the selected scrambling sequence to an input of an XOR device 42. The term data buffer as used herein is defined as any device that stores blocks of user data while the data dependent seed selector 40 identifies the scrambling sequence or seed that is used to scramble the user data. The scrambling sequence is data-dependent in that it depends upon the user data in the data buffer 38. In some implementations, the blocks of user data may include 4096 bits, which can be arranged as 410 10-bit symbols.

A delayed output of the data buffer 38 is also output to the XOR device 42 when the scrambling sequence is found. The delay of the data buffer 38 is sufficient to allow the scrambling sequence to be generated by the data dependent seed selector 40. An output of the XOR device 42 and overhead bits that are output by the data dependent seed selector 40 are input to an ECC ENC 44, which appends any scrambler overhead bits to the scrambled user data. The ECC ENC 44 generates ECC and/or CRC bits based on the scrambled user data and/or the overhead bits. The write path 36 may additionally include post-coding devices that perform bit interleaving, segmenting and inversion, and/or all-zero symbol replacement. Post-code encoding and decoding is described further in "Improved Data Coding for Enforcing Constraints on Ones and Zeros in a Communications Channel,", U.S. patent application Ser. No. 10/423,552, which was filed on Apr. 25, 2003 and which is hereby incorporated by reference in its entirety.

Figure 4:
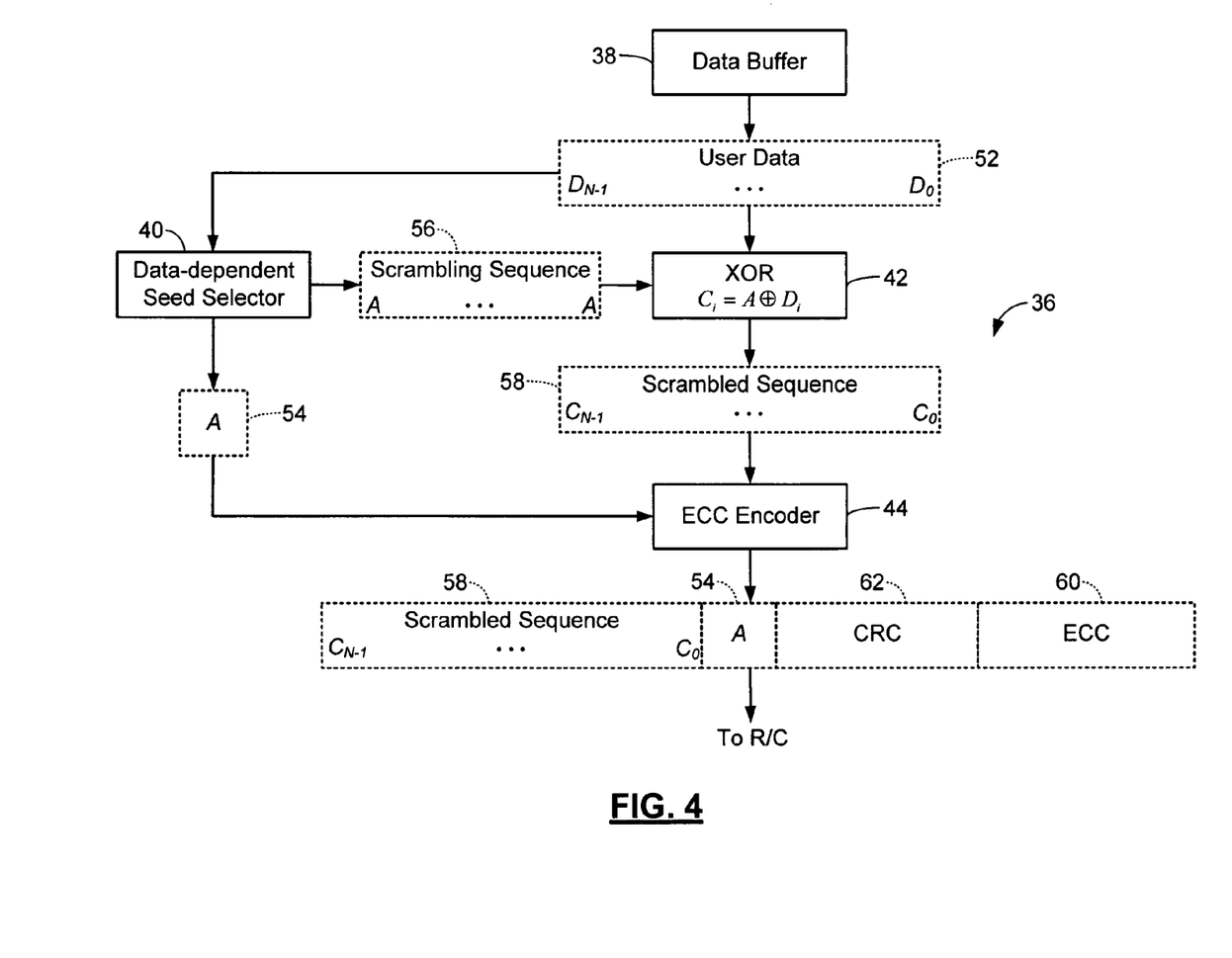
FIG. 4 illustrates data encoding in the data-dependent scrambler of FIG. 3.

Referring now to FIG. 4, in some configurations of the present invention, a 10-bit symbol user data sequence $D=\{D_{N-1}, D_{N-2}, \ldots, D_0\}$ of size N, illustrated at 52, is scrambled. For example, when the block of user data includes 4096 bits, there are 410 symbols. The data dependent seed selector 40 finds a suitable scrambling seed A, illustrated at 54. A scrambling sequence, illustrated at 56, is then formed by repeating symbol A for N times. The XOR device 42 generates a scrambled sequence $C=\{C_{N-1}, C_{N-2}, \ldots, C_0\}$, illustrated at 58, which is a bit-wise XOR of the scrambling sequence $\{A, A, \ldots, A\}$ and the user data sequence $D=\{D_{N-1}, D_{N-2}, \ldots, D_0\}$. In FIG. 4, the typographic symbol $\oplus$ denotes the XOR operator.

During operation, the user data is input to the data dependent seed selector 40. The data dependent seed selector 40 analyzes the user data so that the scrambling seed A can be determined. The data buffer 38 stores the user data. After the scrambling seed A is determined, the data buffer 38 releases the stored data to the XOR device 42 while the data dependent seed selector 40 repeats the seed pattern A until the stored data in the data buffer 38 is exhausted.

A first input of the ECC ENC 44 receives the scrambling seed A as the overhead bits and a second input to the ECC ENC 44 receives the scrambled sequence $C=\{C_{N-1}, C_{N-2}, \ldots, C_0\}$. The ECC ENC 44 appends the scrambling seed A as well as any generated ECC and/or CRC bits, illustrated at 60 and 62, respectively, to the scrambled sequence $C=\{C_{N-1}, C_{N-2}, \ldots, C_0\}$. For binary signaling with a symbol size M, there are $2^M$ possible symbols. For example, for a 10-bit symbol size, M=10 and there are $2^{10}=1024$ possible symbols. These symbols form a seed set S. It is desirable for the data dependent seed selector 40 to limit long "1" and/or "0" patterns in the scrambled sequence $C=\{C_{N-1}, C_{N-2}, \ldots, C_0\}$. Therefore, based on a given data sequence $D=\{D_{N-1}, D_{N-2}, \ldots, D_0\}$, the data dependent seed selector 40 marks symbols in the seed set S as "used symbols". After analyzing all of data sequence $D=\{D_{N-1}, D_{N-2}, \ldots, D_0\}$, the data dependent seed selector 40 selects an "unused symbol" in the seed set S as the scrambling seed A.

Since the XOR of two identical symbols produces an all "0" pattern, the data dependent seed selector 40 designates every $D_i$ in S as a used symbol. Finding a scrambling seed A from the remaining unused symbols in the seed set S is always possible if $N<2^M$, where M is the symbol size. For example, it is always possible to find a scrambling seed A in S when $N<2^{10}=1024$ for 10-bit symbols. This ensures that at least one "1" exists in each of the scrambled symbols $C_i$ in the scrambled sequence $C=\{C_{N-1}, C_{N-2}, \ldots, C_0\}$. This equates to a minimum Hamming weight of 10% for the bits in each $C_i$ as well as the entire scrambled sequence $C=\{C_{N-1}, C_{n-2}, \ldots, C_0\}$. The worst case run of zeros thus cannot be greater than two less than twice the number of bits in a symbol, or 18 (for 10-bit symbols).

The data dependent seed selector 40 of the present invention ensures a minimum Hamming weight of 15% in the scrambled sequence $C=\{C_{N-1}, C_{N-2}, \ldots, C_0\}$ (for 10-bit symbols). This is achieved by designating symbols in the seed set S as used symbols based on the Hamming distance between sequential pairs of symbols, $D_i$ and $D_{i-1}$, in data sequence $D=\{D_{N-1}, D_{N-2}, \ldots, D_0\}$. The Hamming distance between two symbols is equal to the number of digits that the symbols do not have in common. For example, in binary signaling, the Hamming distance between 1110 and 1100 is equal to one, because the binary sequences differ by only one bit.

Figure 5:
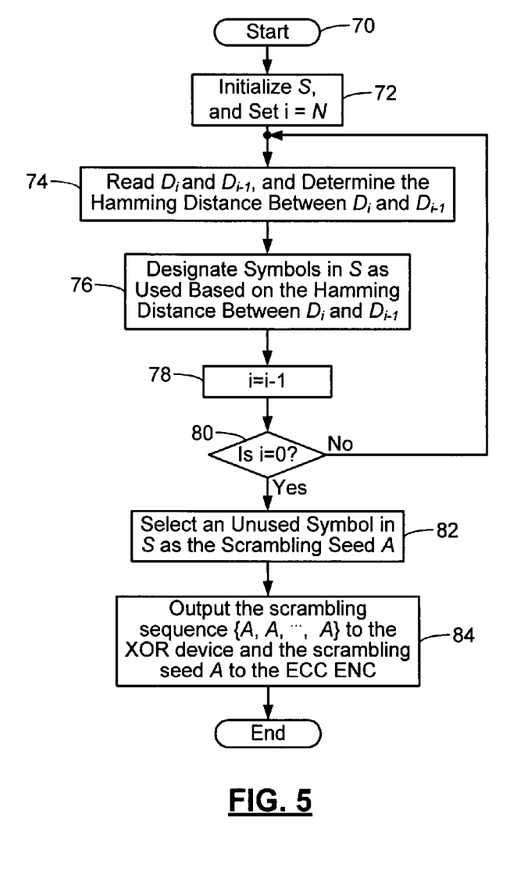
FIG. 5 is a flowchart illustrating steps performed by the data-dependent scrambler of FIG. 3.

Referring now to FIG. 5, a scrambler algorithm for a data sequence $D=\{D_{N-1}, D_{N-2}, \ldots, D_0\}$ of size N begins in step 70. In step 72, a table of possible seeds S is initialized and a loop index i is set equal to N. In step 74, the data dependent seed selector 40 reads $D_i$ and $D_{i-1}$ and determines the Hamming distance between $D_i$ and $D_{i-1}$. In step 76, the data dependent seed selector 40 designates symbols in the seed set S as used symbols based on the Hamming distance between $D_i$ and $D_{i-1}$. In step 78, control decrements i. In step 80, control determines whether i is equal to zero. If false, control returns to step 74. If true, control proceeds to step 82. In step 82, the data dependent seed selector 40 selects a scrambling seed A from the remaining unused symbols in the seed set S. In step 84, the data dependent seed selector 40 outputs the scrambling sequence $\{A, A, \ldots, A\}$ to the XOR device 42 and the scrambling seed A to the ECC ENC 44 and control ends.

Figure 6A:
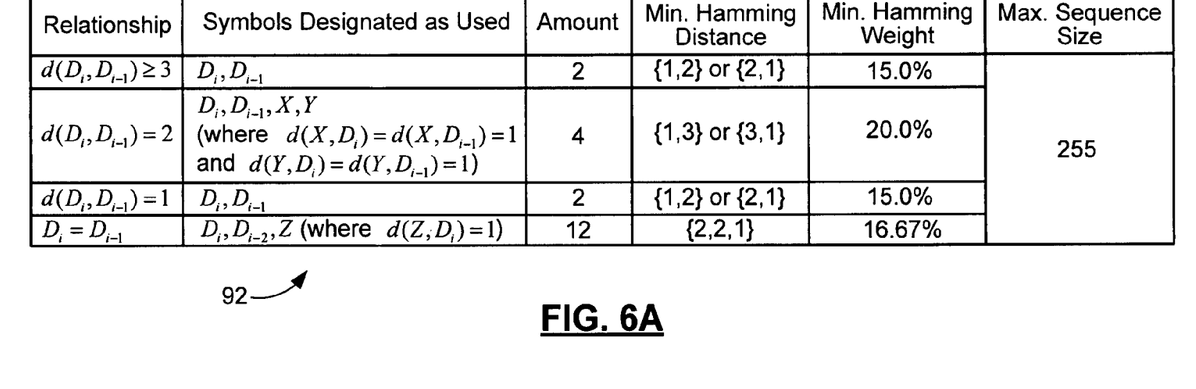
FIG. 6A is a table that illustrates a first seed set algorithm.

FIG. 6A illustrates a first seed set algorithm 92 that designates symbols in the seed set S as used symbols based on the Hamming distance between $D_i$ and $D_{i-1}$ in data sequence $D=\{D_{N-1}, D_{N-2}, \ldots, D_0\}$. The first seed set algorithm 92 simultaneously examines a maximum of three sequential symbols in data sequence D. When the Hamming distance between $D_i$ and $D_{i-1}$ is greater than or equal to three, the data dependent seed selector 40 designates symbols $D_i$ and $D_{i-1}$ as used symbols in the seed set S. This designates a total of two symbols in the seed set S as used symbols for the sequential pair of symbols. As a result, the minimum Hamming distance between a scrambling seed A and $D_i$ is one. In that case, the minimum Hamming distance between A and $D_{i-1}$ is two. This is because $D_i$ and $D_{i-1}$ have a minimum of three bits that are different. The reverse case is also true. If the Hamming distance between the scrambling seed A and $D_{i-1}$ is equal to one, the Hamming distance between A and $D_i$ is greater than or equal to two. This produces a minimum Hamming weight of 3/20=15% for the combination of $C_i$ and $C_{i-1}$ in the scrambled sequence $C=\{C_{N-1}, C_{N-2}, \ldots, C_0\}$ (for 10-bit symbols).

When the Hamming distance between $D_i$ and $D_{i-1}$ is equal to two, the data dependent seed selector 40 designates symbols $D_i$ and $D_{i-1}$ as used symbols in the seed set S. Additionally, the data dependent seed selector 40 designates symbols X and Y as used in S. Symbol X has a Hamming distance from both $D_i$ and $D_{i-1}$ that is equal to one. Symbol Y also has a Hamming distance from both $D_i$ and $D_{i-1}$ that is equal to one. When the Hamming distance between $D_i$ and $D_{i-1}$ is equal to two, $D_i$ and $D_{i-1}$ have two bits that are different. Symbols X and Y are determined by the two bits of $D_i$ and $D_{i-1}$ that differ. This designates a total of four symbols in S as used symbols for the sequential pair of symbols. As a result, the minimum Hamming distance between a scrambling seed A and $D_i$ is equal to one. In that case, the minimum Hamming distance between A and $D_{i-1}$ is equal to three. As in the case where the Hamming distance between $D_i$ and $D_{i-1}$ is greater than or equal to four, the reverse is also true. This produces a minimum Hamming weight of 4/20=20% for the combination of $C_i$ and $C_{i-1}$ in the scrambled sequence $C=\{C_{N-1}, C_{N-2}, \ldots, C_0\}$.

When the Hamming distance between $D_i$ and $D_{i-1}$ is equal to one, the data dependent seed selector 40 designates symbols $D_i$ and $D_{i-1}$ as used symbols in the seed set S. This designates a total of two symbols as used symbols in S for the sequential pair of symbols. As a result, the minimum Hamming distance between a scrambling seed A and $D_i$ is equal to one. In that case, the minimum Hamming distance between A and $D_{i-1}$ is equal to two. As in the case where the Hamming distance between $D_i$ and $D_{i-1}$ is greater than or equal to three, the reverse is also true. This produces a minimum Hamming weight of 3/20=15% for the combination of $C_i$ and $C_{i-1}$ in the scrambled sequence $C=\{C_{N-1}, C_{N-2}, \ldots, C_0\}$.

When symbols $D_i$ and $D_{i-1}$ are equal, the data dependent seed selector 40 also examines symbol $D_{i-2}$. The data dependent seed selector 40 designates symbols $D_i$ and $D_{i-2}$ as used symbols in the seed set S. The data dependent seed selector 40 additionally designates a set of symbols Z as used symbols in S. Z includes all symbols that have Hamming distances from $D_i$ (and thus $D_{i-1}$) that are equal to one. Set Z includes ten symbols for 10-bit symbols and is determined by individually determining the one's complement of each of the bits of $D_i$ or $D_{i-1}$. This designates a total of twelve symbols as used symbols in S for the three sequential symbols. As a result, the minimum Hamming distance between a scrambling seed A and $D_i$ or $D_{i-1}$ is equal to two. In that case, the minimum Hamming distance between A and $D_{i-2}$ is equal to one. This produces a minimum Hamming weight of 5/30=16.67% for the combination of $C_i$, $C_{i-1}$, and $C_{i-2}$ in the scrambled sequence $C=\{C_{N-1}, C_{N-2}, \ldots, C_0\}$.

The data dependent seed selector 40 designates a maximum of twelve symbols as used symbols in the seed set S for every three sequential symbols in data sequence $D=\{D_{N-1}, D_{N-2}, \ldots, D_0\}$ according to the first seed set algorithm 92. This restricts the data sequence size N to $N<|2^{10}/12|*3=255$ symbols (for 10-bit symbols) for a single scrambling seed A. Therefore, for data sequences that have 255 or more symbols, more than one scrambling seed must be used to scramble the entire data sequence. For example, a first scrambling seed $A_1$ may be used to scramble the first half of a data sequence, and a second scrambling seed $A_2$ may be used to scramble a second half of a data sequence.

Figure 6B:
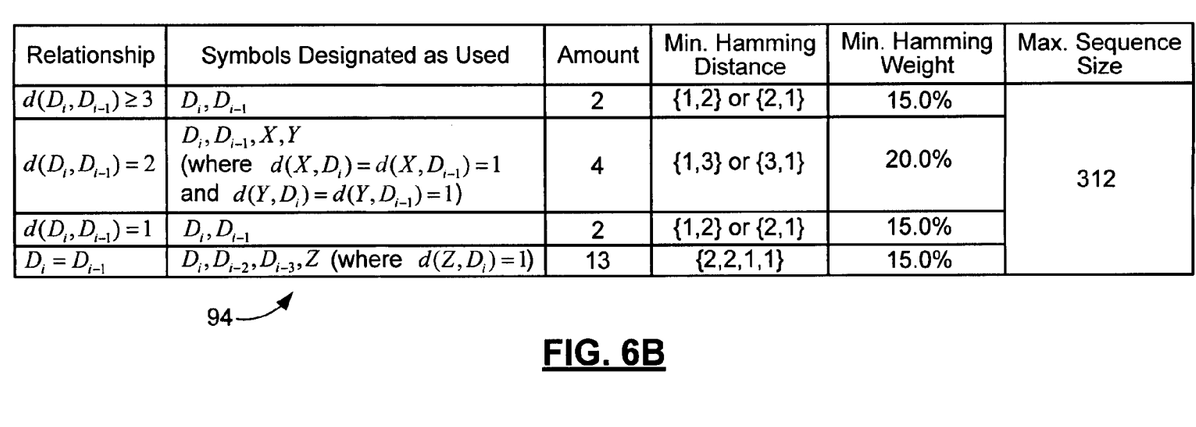
FIG. 6B is a table that illustrates a second seed set algorithm.

FIG. 6B illustrates a second seed set algorithm 94 that simultaneously examines a maximum of four sequential symbols in data sequence D. The second seed set algorithm 94 is identical to the first seed set algorithm 92 when the Hamming distance between $D_i$ and $D_{i-1}$ is greater than or equal to three, equal to two, or equal to one.

When symbols $D_i$ and $D_{i-1}$ are equal, the data dependent seed selector 40 also examines symbols $D_{i-2}$ and $D_{i-3}$. The data dependent seed selector 40 designates symbols $D_i$, $D_{i-2}$, and $D_{i-3}$ as used symbols in the seed set S. The data dependent seed selector 40 additionally designates set Z as used symbols in S as in the first seed set algorithm 92. This designates a total of 13 symbols as used symbols in S for the four sequential symbols. As a result, the minimum Hamming distance between a scrambling seed A and $D_i$ or $D_{i-1}$ is equal to two. Also, the minimum Hamming distance between A and $D_{i-2}$ or $D_{i-3}$ is equal to one. This produces a minimum Hamming weight of 6/40=15% for the combination of $C_i$, $C_{i-1}$, $C_{i-2}$, and $C_{i-3}$ in the scrambled sequence $C=\{C_{N-1}, C_{N-2}, \ldots, C_0\}$.

The data dependent seed selector 40 designates a maximum of thirteen symbols as used symbols in seed set S for every four sequential symbols in data sequence D according to the second seed set algorithm 94. This restricts the data sequence size N to $N<|2^{10}/13|*4=312$ symbols (for 10-bit symbols) for a single scrambling seed A. Therefore, for data sequences that have 312 or more symbols, more than one scrambling seed must be used to scramble the entire data sequence. Therefore, the second seed set algorithm 94 allows a larger maximum data sequence size N than the first seed set algorithm 92 while still ensuring a minimum Hamming weight of fifteen percent in the scrambled sequence $C=\{C_{N-1}, C_{N-2}, \ldots, C_0\}$.

Figure 7A:
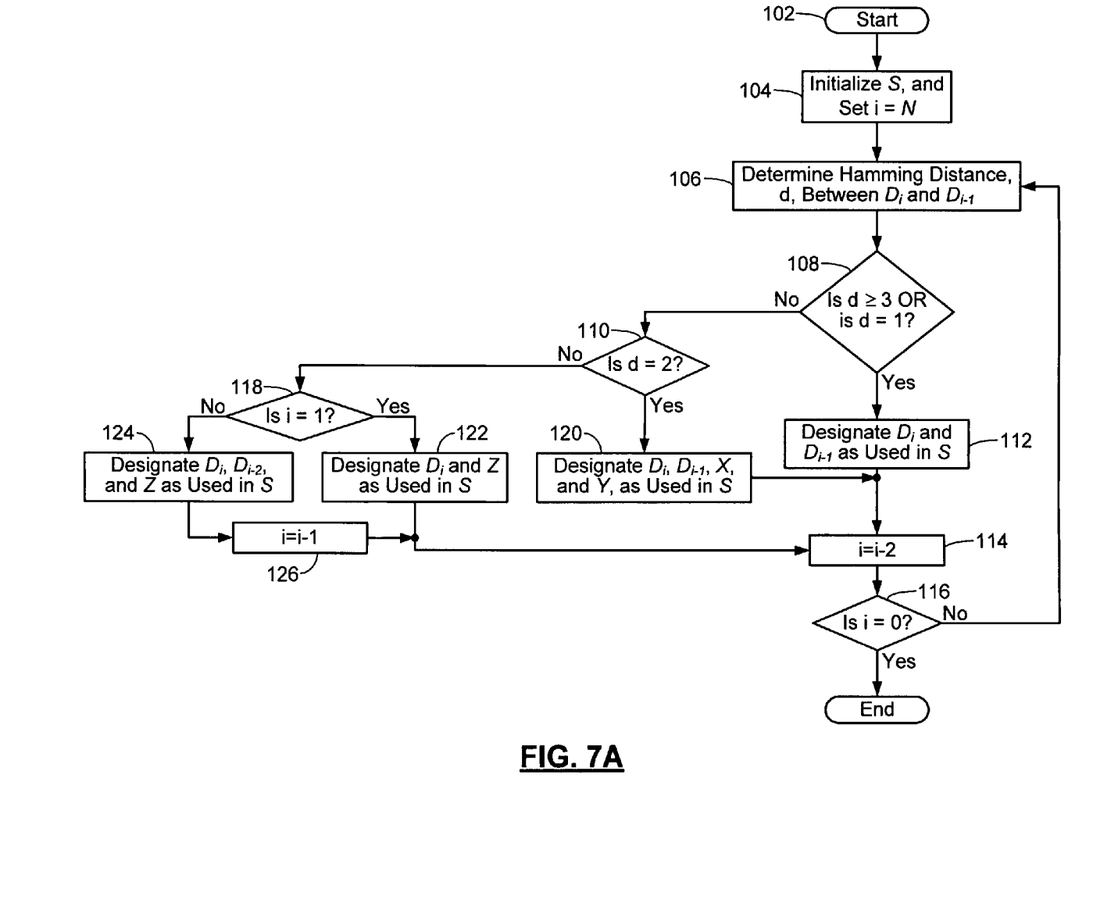
FIG. 7A is a flowchart illustrating steps according to the first seed set algorithm.

Referring now to FIG. 7A, the first seed set algorithm 92 for a data sequence $D=\{D_{N-1}, D_{N-2}, \ldots, D_0\}$ of size N begins in step 102. In step 104, a table of possible seeds S is initialized and a loop index i is set equal to N. In step 106, the data dependent seed selector 40 determines the Hamming distance, d, between sequential symbols $D_i$ and $D_{i-1}$ in D. In step 108, control determines whether d is greater than or equal to three or whether d is equal to one. If false, control proceeds to step 110. If true, control proceeds to step 112. In step 112, the data dependent seed selector 40 designates symbols $D_i$ and $D_{i-1}$ as used symbols in S. In step 114, control sets i=i−2. In step 116, control determines whether i is equal to zero. If true, control ends. If false control returns to step 106.

In step 110, control determines whether d is equal to two. If false, control proceeds to step 118. If true, control proceeds to step 120. In step 120, the data dependent seed selector 40 designates symbols $D_i$, $D_{i-1}$, X, and Y as used in S and control proceeds to step 114. In step 118, control determines whether i is equal to one. If true control proceeds to step 122. If false, control proceeds to step 124. In step 122, the data dependent seed selector 40 designates symbols $D_i$ and Z as used in S and control proceeds to step 114. In step 124, the data dependent seed selector 40 designates symbols $D_i$, $D_{i-2}$, and Z as used in S. In step 126, control decrements i and control proceeds to step 96.

Figure 7B:
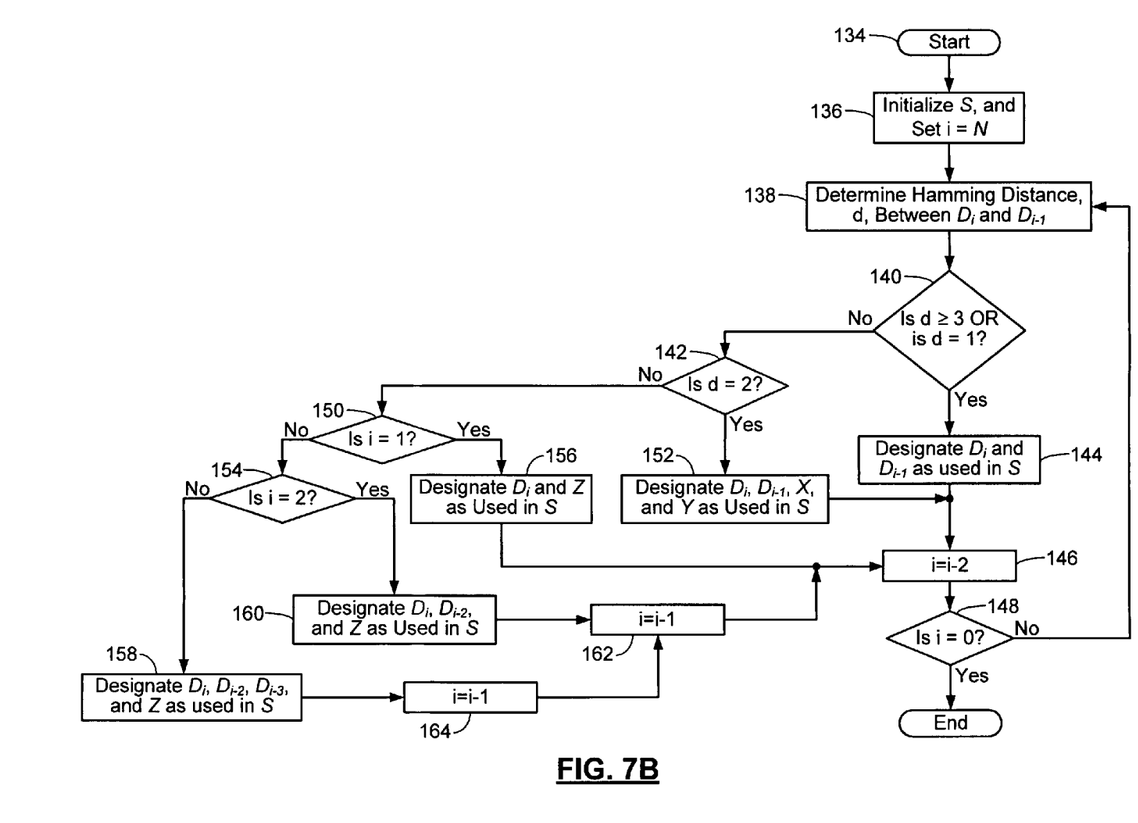
FIG. 7B is a flowchart illustrating steps according to the second seed set algorithm.

Referring now to FIG. 7B, the second seed set algorithm 94 for a data sequence D={$D_{N-1}, D_{N-2}, \ldots, D_0$} of size N begins in step 134. In step 136, a table of possible seeds S is initialized and a loop index i is set equal to N. In step 138, the data dependent seed selector 40 determines the Hamming distance, d, between sequential symbols $D_i$ and $D_{i-1}$ in D. In step 140, control determines whether d is greater than or equal to three or if d is equal to one. If false, control proceeds to step 142. If true, control proceeds to step 144. In step 144, the data dependent seed selector 40 designates symbols $D_i$ and $D_{i-1}$ as used in S. In step 146, control sets i=i−2. In step 148, control determines whether i is equal to zero. If true, control ends. If false, control returns to step 138.

In step 142, control determines whether d is equal to two. If false control proceeds to step 150. If true, control proceeds to step 152. In step 152, the data dependent seed selector 40 designates symbols $D_i$, $D_{i-}$, X, and Y as used in S and control proceeds to step 146. In step 150, control determines whether i is equal to one. If false, control proceeds to step 154. If true, control proceeds to step 156. In step 156, the data dependent seed selector 40 designates symbols $D_i$ and Z as used in S and control proceeds to step 146. In step 154, control determines whether i is equal to two. If false, control proceeds to step 158. If true, control proceeds to step 160. In step 160, the data dependent seed selector 40 designates symbols $D_i$, $D_{i-2}$, and Z as used in S. In step 162, control decrements i and control proceeds to step 146. In step 158, the data dependent seed selector 40 designates symbols $D_i$, $D_{i-2}$, $D_{i-3}$, and Z as used in S. In step 164, control decrements i and control proceeds to step 162.

Figure 8A:
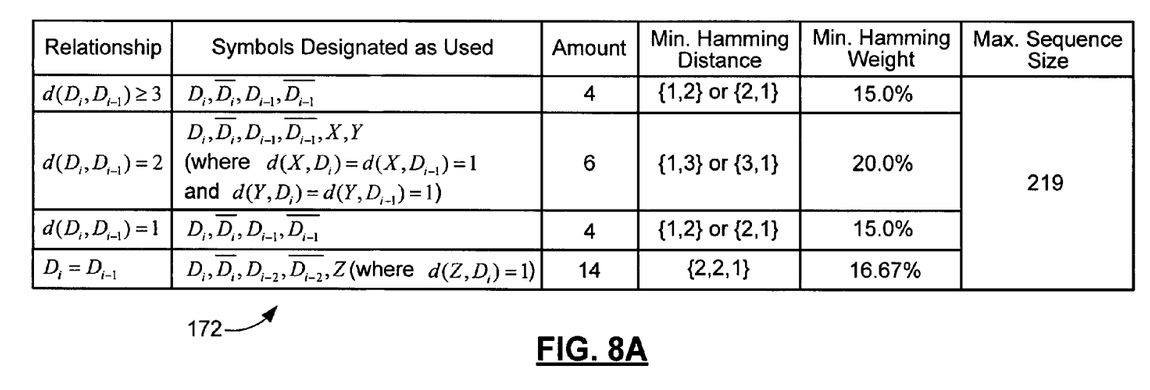
FIG. 8A is a table that illustrates a third seed set algorithm.
Figure 8B:
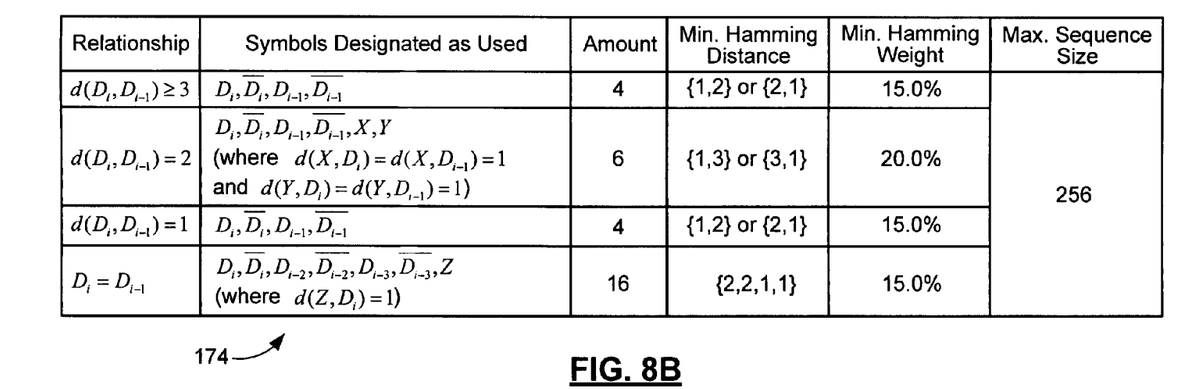
FIG. 8B is a table that illustrates a fourth seed set algorithm.

Referring now to FIGS. 8A and 8B, in some applications, including at least some storage systems, it is required that the scrambled sequence also not contain long "1" patterns. This can be met by disallowing the all-ones symbol from appearing in scrambled sequence C. Since the XOR of a symbol and the one's complement of the symbol produces an all "1" pattern, the data dependent seed selector 40 additionally designates every $\overline{D_i}$ along with every $D_i$ in S as a used symbol, where $\overline{D_i}$ indicates the one's complement of $D_i$. In that case, when designating only $D_i$ and $\overline{D_i}$ as used in S, finding a scrambling seed A from the remaining unused symbols in S is always possible if $2N<2^M$. For example, it is always possible to find a scrambling seed A in S if $2N<2^{10}$ for 10-bit symbols. This ensures that an all "1" pattern does not exist in any of the scrambled symbols $C_i$ in the scrambled sequence C={$C_{N-1}, C_{N-2}, \ldots, C_0$}.

A third seed set algorithm 172 illustrated in FIG. 8A is identical to the first seed set algorithm 92 illustrated in FIG. 6A with one exception. The data dependent seed selector 40 designates symbols $D_i$ in the data sequence D as well as the one's complement $\overline{D_i}$ of the symbols in the data sequence D as used in seed set S. Therefore, when the Hamming distance between $D_i$ and $D_{i-1}$ is greater than or equal to three, the data dependent seed selector 40 designates symbols $D_i$, $\overline{D_i}$, $D_{i-1}$, and $\overline{D_{i-1}}$ as used in S. This designates a total of four symbols as used in S for the sequential pair of symbols. This produces a minimum Hamming weight of 3/20=15% for the combination of $C_i$ and $C_{i-1}$ in the scrambled sequence C={$C_{N-1}, C_{N-2}, \ldots, C_0$}.

When the Hamming distance between $D_i$ and $D_{i-1}$ is equal to two, the data dependent seed selector 40 designates symbols $D_i$, $\overline{D_i}$, $D_{i-1}$, and $\overline{D_{i-1}}$ as used in S. Additionally, the data dependent seed selector 40 designates symbols X and Y as used in S as in FIG. 6A. This designates a total of six symbols as used in S for the sequential pair of symbols. This produces a minimum Hamming weight of 4/20=20% for the combination of $C_i$ and $C_{i-1}$ in the scrambled sequence C={$C_{N-1}, C_{N-2}, \ldots, C_0$}.

When the Hamming distance between $D_i$ and $D_{i-1}$ is equal to one, the data dependent seed selector 40 designates symbols $D_i$, $\overline{D_i}$, $D_{i-1}$, and $\overline{D_{i-1}}$ as used in S. This designates a total of four symbols as used in S for the sequential pair of symbols. This produces a minimum Hamming weight of 3/20=15% for the combination of $C_i$ and $C_{i-1}$ in the scrambled sequence C={$C_{N-1}, C_{N-2}, \ldots, C_0$}.

When symbols $D_i$ and $D_{i-1}$ are equal, the data dependent seed selector 40 designates symbols $D_i$, $\overline{D_i}$, $D_{i-2}$, and $\overline{D_{i-2}}$ as used in S. The data dependent seed selector 40 additionally designates symbols Z as used in S as in FIG. 6A. This designates a total of fourteen symbols as used in S for the three sequential symbols. This produces a minimum Hamming weight of 5/30=16.67% for the combination of $C_i$, $C_{i-1}$, and $C_{i-2}$ in the scrambled sequence C={$C_{N-1}, C_{N-2}, \ldots, C_0$}.

The data dependent seed selector 40 designates a maximum of fourteen symbols as used in S for every three sequential symbols in the data sequence D according to the third seed set algorithm 172. This restricts the data sequence size N to N<|$2^{10}$/14|*3=219 symbols (for 10-bit symbols) for a single scrambling seed A. Therefore, for data sequences that have 219 or more symbols, more than one scrambling seed must be used to scramble the entire data sequence.

FIG. 8B illustrates a fourth seed set algorithm 174 that is identical to the third seed set algorithm 172 when the Hamming distance between $D_i$ and $D_{i-1}$ is greater than or equal to three, equal to two, or equal to one. When symbols $D_i$ and $D_{i-1}$ are equal, the data dependent seed selector 40 designates symbols $D_i$, $\overline{D_i}$, $D_{i-2}$, $\overline{D_{i-2}}$, $D_{i-3}$, and $\overline{D_{i-3}}$ as used in seed set S. The data dependent seed selector 40 additionally marks set Z as used in S as in the third seed set algorithm 172. This designates a total of sixteen symbols as used in S for the four sequential symbols. This produces a minimum Hamming weight of 6/40=15% for the combination of $C_i$, $C_{i-1}$, $C_{i-2}$, and $C_{i-3}$ in the scrambled sequence C={$C_{N-1}, C_{N-2}, \ldots, C_0$}.

The data dependent seed selector 40 designates a maximum of sixteen symbols as used in S for every four sequential symbols in the data sequence D={$D_{N-1}, D_{N-2}, \ldots, D_0$} according to the fourth seed set algorithm 174. This restricts the data sequence size N to N<<|$2^{10}$/16|*4=256 symbols (for 10-bit symbols) for a single scrambling seed A. Therefore, for data sequences that have 256 or more symbols, more than one scrambling seed must be used to scramble the entire data sequence. The third and fourth seed set algorithms 172 and 174, respectively, have a smaller maximum sequence size N than the first and second seed set algorithms 92 and 94, respectively. This is due to the fact that the third and fourth seed set algorithms 172 and 174, respectively, designate the symbols in the data sequence as well as the one's complement of the symbols in the data sequence as used in seed set S.

Figure 9A:
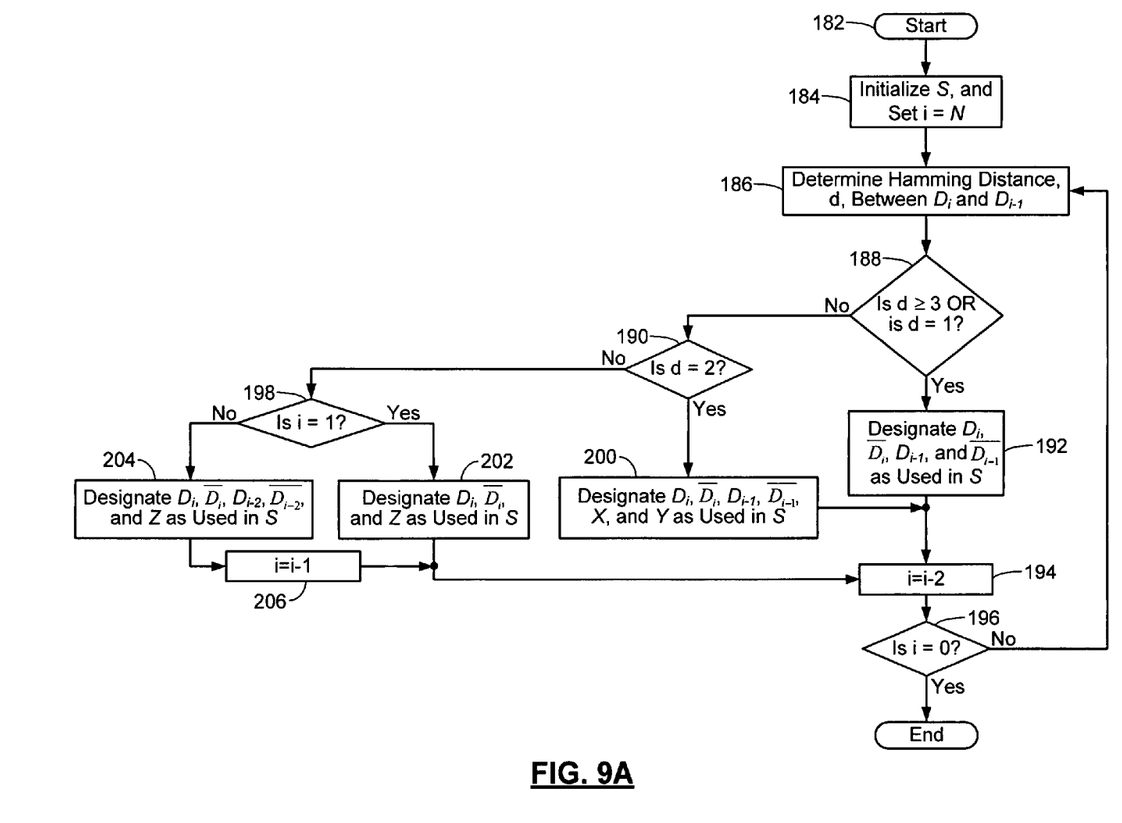
FIG. 9A is a flowchart illustrating steps according to the third seed set algorithm.
Figure 9B:
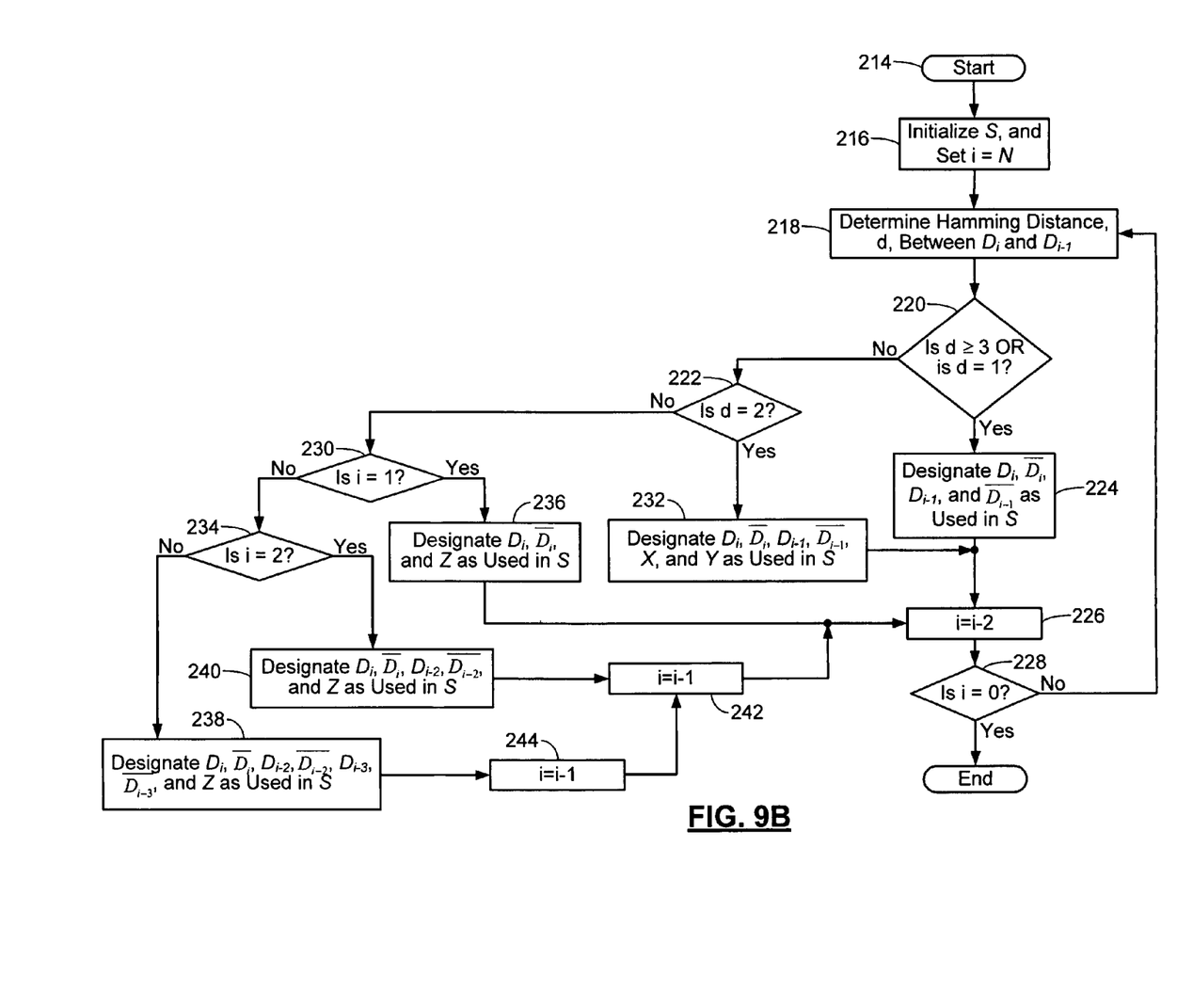
FIG. 9B is a flowchart illustrating steps according to the fourth seed set algorithm.

Referring now to FIG. 9A, the third seed set algorithm 172 for a data sequence D={$D_{N-1}, D_{N-2}, \ldots, D_0$} of size N begins in step 182. In step 184, a table of possible seeds S is initialized and a loop index i is set equal to N. In step 186, the data dependent seed selector 40 determines the Hamming distance, d, between sequential symbols $D_i$ and $D_{i-1}$ in D. In step 188, control determines whether d is greater than or equal to three or whether d is equal to one. If false, control proceeds to step 190. If true control proceeds to step 192. In step 192, the data dependent seed selector 40 designates symbols $D_i$, $\overline{D_i}$, $D_{i-1}$, and $\overline{D_{i-1}}$ as used in S. In step 194, control sets i=i−2. In step 196, control determines whether i is equal to zero. If true, control ends. If false control returns to step 186.

In step 190, control determines whether d is equal to two. If false, control proceeds to step 198. If true, control proceeds to step 200. In step 200, the data dependent seed selector 40 designates symbols $D_i$, $\overline{D_i}$, $D_{i-1}$, $\overline{D_{i-1}}$, X, and Y as used in S and control proceeds to step 194. In step 198, control determines whether i is equal to one. If true, control proceeds to step 202. If false, control proceeds to step 204. In step 202, the data dependent seed selector 40 designates symbols $D_i$, $\overline{D_i}$, and Z as used in S and control proceeds to step 194. In step 204, the data dependent seed selector 40 designates symbols $D_i$, $\overline{D_i}$, $D_{i-2}$, $\overline{D_{i-2}}$, and Z as used in S. In step 206, control decrements i and control proceeds to step 194.

Referring now to FIG. 7B, the fourth seed set algorithm 174 for a data sequence $D=\{D_{N-1}, D_{N-2}, \ldots, D_0\}$ of size N begins in step 214. In step 216, a table of possible seeds S is initialized and a loop index i is set equal to N. In step 218, the data dependent seed selector 40 determines the Hamming distance, d, between sequential symbols $D_i$ and $D_{i-1}$ in D. In step 220, control determines whether d is greater than or equal to three or if d is equal to one. If false, control proceeds to step 222. If true, control proceeds to step 224. In step 224, the data dependent seed selector 40 designates symbols $D_i$, $\overline{D_i}$, $D_{i-1}$, and $\overline{D_{i-1}}$ as used in S. In step 226, control sets i=i−2. In step 228, control determines whether i is equal to zero. If true, control ends. If false, control returns to step 218.

In step 222, control determines whether d is equal to two. If false control proceeds to step 230. If true, control proceeds to step 232. In step 232, the data dependent seed selector 40 designates symbols $D_i$, $\overline{D_i}$, $D_{i-1}$, $\overline{D_{i-1}}$, X, and Y as used in S and control proceeds to step 226. In step 230, control determines whether i is equal to one. If false, control proceeds to step 234. If true, control proceeds to step 236. In step 236, the data dependent seed selector 40 designates symbols $D_i$, $\overline{D_i}$, and Z as used in S and control proceeds to step 226. In step 234, control determines whether i is equal to two. If false, control proceeds to step 238. If true, control proceeds to step 240. In step 240, the data dependent seed selector 40 designates symbols $D_i$, $\overline{D_i}$, $D_{i-2}$, $\overline{D_{i-2}}$, and Z as used in S. In step 242, control decrements i and control proceeds to step 226. In step 238, the data dependent seed selector 40 designates symbols $D_i$, $\overline{D_i}$, $D_{i-2}$, $\overline{D_{i-2}}$, $D_{i-3}$, $\overline{D_{i-3}}$, and Z as used in S. In step 244, control decrements i and control proceeds to step 242.

Application-specific integrated circuits, dedicated circuits, software and a processor, discrete circuits, and/or any other suitable manner can be used to implement configurations described herein. Thus, items referred to as "devices" in the examples described above can be, but are not necessarily discrete components.

The data dependent seed selector 40 of the present invention ensures a minimum Hamming weight of 15% in scrambled sequences when 10-bit symbols are employed. This is an improvement over methods that only ensure a minimum Hamming weight of 10% in scrambled sequences. However, data sequences with other symbol sizes may be employed. The present invention also ensures sufficient transition density in scrambled sequences by preventing long "1" patterns from occurring in scrambled symbols. Furthermore, the data dependent seed selector 40 only generates a scrambler overhead of M bits, where M is the symbol size, when one scrambling seed is required for a data sequence.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

What is claimed is:

1. A seed generator for a scrambler, comprising:
 a seed set identifier that identifies a seed set based on received user data symbols, which include a plurality of M-bit symbols; and
 a seed selector that selects a scrambling seed for said scrambler from said seed set based on Hamming distances between at least two of said M-bit symbols in said seed set.

2. A communications channel comprising the seed generator of claim 1 and further comprising a scrambler that communicates with said seed generator and that generates scrambled user data based on said user data symbols and said scrambling seed.

3. The communications channel of claim 2 wherein said seed generator ensures a minimum Hamming weight of 15 percent in said scrambled user data.

4. The seed generator of claim 1 wherein said seed generator compares first and second user data symbols in said plurality of M-bit symbols.

5. The seed generator of claim 4 wherein said seed generator removes said first and second user data symbols from said seed set when a Hamming distance between said first user data symbol and said second user data symbol is greater than or equal to three.

6. The seed generator of claim 4 wherein said seed generator removes said first and second user data symbols from said seed set, and symbols from said seed set that have Hamming distances of one from said first and second user data symbols when a Hamming distance between said first user data symbol and said second user data symbol is equal to two.

7. The seed generator of claim 4 wherein said seed generator removes said first and second user data symbols from said seed set when a Hamming distance between said first user data symbol and said second user data symbol is equal to one.

8. The seed generator of claim 4 wherein said seed generator removes said first user data symbol from said seed set, a third user data symbol from said seed set that is adjacent to said second user data symbol, and symbols from said seed set that have Hamming distances of one from said first user data symbol when said first user data symbol is equal to said second user data symbol.

9. The seed generator of claim 4 wherein said seed generator removes said first user data symbol from said seed set, a third user data symbol from said seed set that is adjacent to said second user data symbol, a fourth user data symbol from said seed set that is adjacent to said third user data symbol, and symbols from said seed set that have Hamming distances of one from said first user data symbol when said first user data symbol is equal to said second user data symbol.

10. The seed generator of claim 4 wherein said seed generator removes said first and second user data symbols from said seed set, a first symbol from said seed set that is the one's complement of said first user data symbol, and a second symbol from said seed set that is the one's complement of said second user data symbol from said seed set when a Hamming distance between said first user data symbol and said second user data symbol is greater than or equal to three.

11. The seed generator of claim 4 wherein said seed generator removes said first and second user data symbols from said seed set, a first symbol from said seed set that is the one's complement of said first user data symbol, a second symbol from said seed set that is the one's complement of said second user data symbol, and symbols from said seed set that have Hamming distances of one from said first user data symbol and said second user data symbol when a Hamming distance between said first user data symbol and said second user data symbol is equal to two.

12. The seed generator of claim 4 wherein said seed generator removes said first and second user data symbols from said seed set, a first symbol from said seed set that is the one's complement of said first user data symbol, and a second symbol from said seed set that is the one's complement of said second user data symbol from said seed set when a Hamming distance between said first user data symbol and said second user data symbol is equal to one.

13. The seed generator of claim 4 wherein said seed generator removes said first user data symbol from said seed set, a first symbol from said seed set that is the one's complement of said first user data symbol, a third user data symbol from said seed set that is adjacent to said second user data symbol, a second symbol from said seed set that is the one's complement of said third user data symbol, and symbols from said seed set that have Hamming distances of one from said first user data symbol when said first user data symbol is equal to said second user data symbol.

14. The seed generator of claim 4 wherein said seed generator removes said first user data symbol from said seed set, a first symbol from said seed set that is the one's complement of said first user data symbol, a third user data symbol from said seed set that is sequential to said second user data symbol, a second symbol from said seed set that is the one's complement of said third user data symbol, a fourth user data symbol from said seed set that is sequential to said third user data symbol, a third symbol from said seed set that is the one's complement of said fourth user data symbol, and symbols from said seed set that have Hamming distances of one from said first user data symbol when said first user data symbol is equal to said second user data symbol.

15. The communications channel of claim 2 further comprising:
   an error correction coding (ECC) encoder (ENC) that communicates with said scrambler and said seed generator, wherein said ECC ENC appends at least one of cyclic redundancy check (CRC) code, ECC, and said scrambling seed to said scrambled user data.

16. The communications channel of claim 2 wherein said scrambler generates said scrambled user data by determining a bit-wise exclusive-OR (XOR) of said scrambling seed and said user data symbols.

* * * * *